United States Patent
Chen et al.

(10) Patent No.: US 9,613,904 B2
(45) Date of Patent: Apr. 4, 2017

(54) SEMICONDUCTOR STRUCTURE AND MANUFACTURING METHOD THEREOF

(71) Applicant: XINTEC INC., Taoyuan (TW)

(72) Inventors: Yu-Tung Chen, Taoyuan (TW);
Chien-Min Lin, Taoyuan (TW);
Chuan-Jin Shiu, Taoyuan (TW);
Chih-Wei Ho, Taoyuan (TW);
Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/140,289

(22) Filed: Apr. 27, 2016

(65) Prior Publication Data

US 2016/0329283 A1    Nov. 10, 2016

Related U.S. Application Data

(60) Provisional application No. 62/156,810, filed on May 4, 2015.

(51) Int. Cl.

| | |
|---|---|
| *H01L 21/4763* | (2006.01) |
| *H01L 21/44* | (2006.01) |
| *H01L 23/04* | (2006.01) |
| *H01L 23/52* | (2006.01) |
| *H01L 23/528* | (2006.01) |
| *H01L 21/027* | (2006.01) |
| *H01L 23/522* | (2006.01) |
| *H01L 21/768* | (2006.01) |
| *H01L 23/00* | (2006.01) |

(52) U.S. Cl.
CPC ...... *H01L 23/5283* (2013.01); *H01L 21/0271* (2013.01); *H01L 21/76804* (2013.01); *H01L 21/76898* (2013.01); *H01L 23/5226* (2013.01); *H01L 24/03* (2013.01); *H01L 24/05* (2013.01); *H01L 2224/0345* (2013.01); *H01L 2224/0557* (2013.01)

(58) Field of Classification Search
CPC ......... H01L 21/76877; H01L 21/76898; H01L 23/481; H01L 23/49827; H01L 2224/10; H01L 2224/119; H01L 2224/13011; H01L 2224/1403; H01L 2224/16135
USPC ......... 257/698, 774; 438/612, 639, 667, 672
See application file for complete search history.

(56) References Cited

U.S. PATENT DOCUMENTS

| | | | |
|---|---|---|---|
| 9,236,429 B2 * | 1/2016 | Yen | ..................... H01L 29/0642 |
| 2009/0166849 A1 | 7/2009 | Jao et al. | |

FOREIGN PATENT DOCUMENTS

| | | |
|---|---|---|
| TW | 200402561 | 2/2004 |
| TW | 201432857 | 8/2014 |

* cited by examiner

*Primary Examiner* — Hsien Ming Lee
(74) *Attorney, Agent, or Firm* — Liu & Liu

(57) ABSTRACT

A semiconductor structure includes a first substrate, a second substrate, a dam layer, a photoresist layer, and a conductive layer. The first substrate has a conductive pad. The second substrate has a through via, a sidewall surface surrounding the through via, a first surface, and a second surface opposite to the first surface. The through via penetrates through the first and second surfaces. The conductive pad is aligned with the through via. The dam layer is located between the first substrate and the second surface. The dam layer protrudes toward the through via. The photoresist layer is located on the first surface, the sidewall surface, the dam layer protruding toward the through via, and between the conductive pad and the dam layer protruding toward the through via. The conductive layer is located on the photoresist layer and the conductive pad.

12 Claims, 7 Drawing Sheets

Providing a first substrate and a second substrate that is bonded to the first substrate, wherein a dam layer is located between the first and second substrates — S1

Etching the second substrate, thereby forming a through via in the second substrate, wherein a conductive pad of the first substrate is exposed through the through via, and at least one portion of the dam layer protrudes toward the through via — S2

Forming a photoresist layer on a surface of the second substrate facing away from the dam layer, a sidewall surface of the second substrate surrounding the through via, the dam layer that protrudes toward the through via, and the conductive pad that is exposed through the through via — S3

Pattering the photoresist layer, such that at least one portion of the conductive pad is exposed through the through via — S4

Forming a conductive layer on the photoresist layer and the conductive pad that is exposed through the through via — S5

Fig. 4

SEMICONDUCTOR STRUCTURE AND MANUFACTURING METHOD THEREOF

RELATED APPLICATIONS

This application claims priority to U.S. provisional Application Ser. No. 62/156,810, filed May 4, 2015, which is herein incorporated by reference.

BACKGROUND

Field of Invention

The present invention relates to a semiconductor structure and a manufacturing method of the semiconductor structure.

Description of Related Art

Generally, in manufacturing a semiconductor structure, two wafers may be bonded together through a dam layer, and a through silicon via (TSV) is formed in one of the wafers, such that a conductive pad of the other wafer is exposed through the TSV.

Thereafter, a chemical vapor deposition (CVD) process may be used to form an oxide layer on a surface of the wafer surrounding the through silicon via, the dam layer, and the conductive pad. Next, an etching process may be used to remove the oxide layer that is located on the conductive pad. As a result, a conductive layer may be formed on the surface of the wafer and the conductive pad.

However, when the two wafers are bonded through the dam layer, the dam layer is likely to protrude toward the through silicon via due to pressure and high temperature, and thus a cavity is formed between the protruding dam layer and the dam layer. The cavity may cause the conductive layer between the dam layer and the conductive layer to be suspended thereon and easily broken, thus reducing product yield. In addition, because chemical vapor deposition (CVD) equipment and etching equipment are expensive, the manufacturing cost of the semiconductor structure is hard to be reduced.

SUMMARY

An aspect of the present invention is to provide a semiconductor structure.

According to an embodiment of the present invention, a semiconductor structure includes a first substrate, a second substrate, a dam layer, a photoresist layer, and a conductive layer. The first substrate has a conductive pad. The second substrate has a through via, a sidewall surface, a first surface, and a second surface opposite to the first surface. The through via penetrates through the first and second surfaces. The sidewall surface surrounds the through via. The conductive pad is aligned with the through via. The dam layer is located between the first substrate and the second surface of the second substrate, and at least one portion of the dam layer protrudes toward the through via. The photoresist layer is located on the first surface and the sidewall surface of the second substrate, the dam layer that protrudes toward the through via, and is located between the conductive pad and the dam layer that protrudes toward the through via. The conductive layer is located on the photoresist layer and the conductive pad.

In one embodiment of the present invention, the dam layer protruding toward the through via has an arc surface.

In one embodiment of the present invention, a cavity is formed between the arc surface and the conductive pad.

In one embodiment of the present invention, the cavity is filled with the photoresist layer.

In one embodiment of the present invention, a connection position between the sidewall surface and the second surface of the second substrate is located on an edge of the arc surface, and another edge of the arc surface is located on the conductive pad.

In one embodiment of the present invention, the semiconductor structure further includes an isolation layer. The isolation layer is located on the second surface of the second substrate.

In one embodiment of the present invention, a diameter of the through via is gradually decreasing from the first surface of the second substrate to the second surface of the second substrate.

Another aspect of the present invention is to provide a manufacturing method of a semiconductor structure.

According to an embodiment of the present invention, a manufacturing method of a semiconductor structure includes the following steps. A first substrate and a second substrate that is bonded to the first substrate are provided, and a dam layer is located between the first and second substrates. The second substrate is etched, thereby forming a through via in the second substrate. A conductive pad of the first substrate is exposed through the through via, and at least one portion of the dam layer protrudes toward the through via. A photoresist layer is formed on a surface of the second substrate facing away from the dam layer, a sidewall surface of the second substrate surrounding the through via, the dam layer that protrudes toward the through via, and the conductive pad that is exposed through the through via. The photoresist layer is patterned, such that at least one portion of the conductive pad is exposed through the through via. A conductive layer is formed on the photoresist layer and the conductive pad that is exposed through the through via.

In one embodiment of the present invention, the step of forming the photoresist layer includes forming the photoresist layer by spin coating.

In one embodiment of the present invention, the step of forming the photoresist layer includes forming the photoresist layer by spray coating.

In one embodiment of the present invention, the step of patterning the photoresist layer includes performing an exposure treatment onto the photoresist layer and performing a development treatment onto the photoresist layer after the exposure treatment.

In one embodiment of the present invention, the step of forming the conductive layer includes forming the conductive layer by sputtering.

In the aforementioned embodiment of the present invention, because the photoresist layer is located on the first surface and the sidewall surface of the second substrate, the dam layer that protrudes toward the through via, and is located between the conductive pad and the dam layer that protrudes toward the through via, the conductive layer is not likely to be suspended in midair between the dam layer and the conductive pad after the conductive layer is formed on the photoresist layer and the conductive pad, thereby preventing the conductive layer from being broken due to suspension in air, thus improving product yield. In addition, a typical oxide layer can be omitted in the semiconductor structure and the manufacturing method thereof in the present invention. Hence, the costs associated with a chemical vapor deposition process and an etching process for forming the typical oxide layer can be saved, thereby reducing the manufacturing cost of the semiconductor structure.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 4 is a flow chart of a manufacturing method of a semiconductor structure according to one embodiment of the present invention;

DETAILED DESCRIPTION

Figure 1:
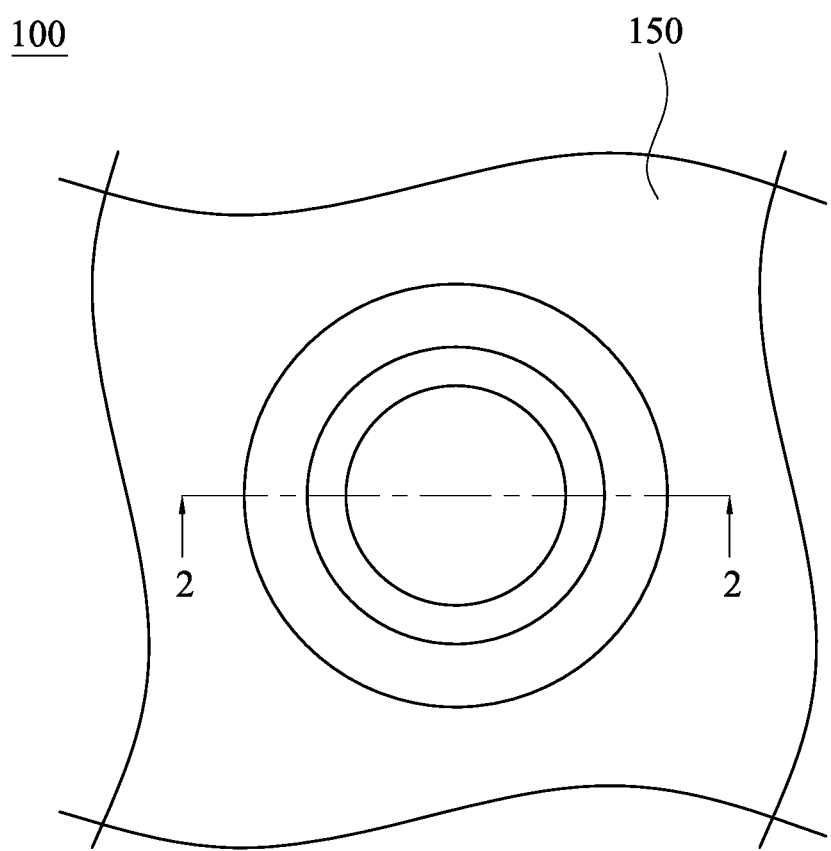
FIG. 1 is a top view of a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
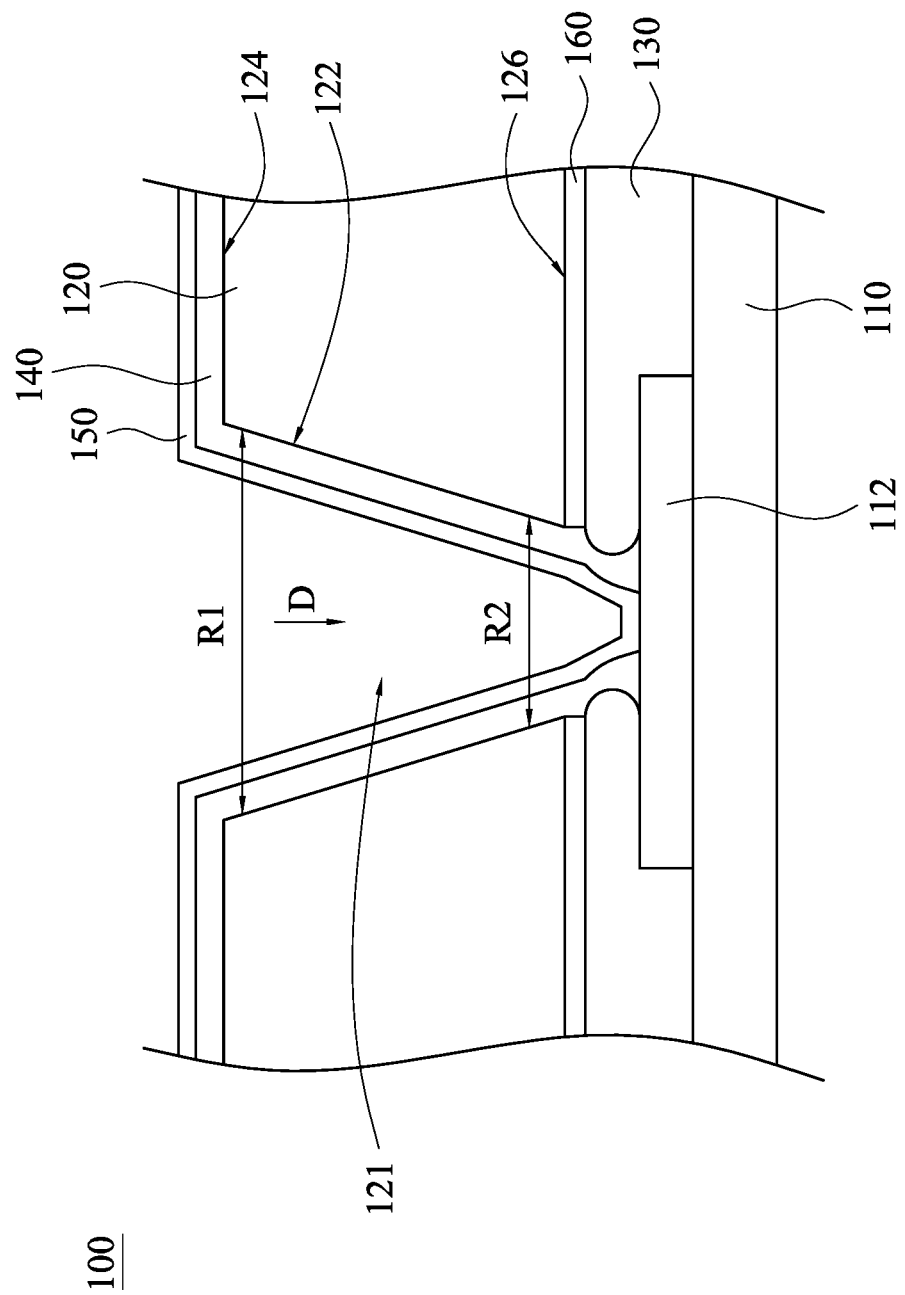
FIG. 2 is a cross-sectional view of the semiconductor structure taken along line 2-2 shown in FIG. 1.

FIG. 1 is a top view of a semiconductor structure 100 according to one embodiment of the present invention. FIG. 2 is a cross-sectional view of the semiconductor structure 100 taken along line 2-2 shown in FIG. 1. As shown in FIG. 1 and FIG. 2, the semiconductor structure 100 includes a first substrate 110, a second substrate 120, a dam layer 130, a photoresist layer 140, and a conductive layer 150. The first substrate 110 has a conductive pad 112. The second substrate 120 has a through via 121, a sidewall surface 122, a first surface 124, and a second surface 126 opposite to the first surface 124. The through via 121 penetrates through the first surface 124 and the second surface 126. The sidewall surface 122 surrounds the through via 121. The conductive pad 112 of the first substrate 110 is aligned with the through via 121 of the second substrate 120. In this embodiment, the first substrate 110 and the second substrate 120 may be made of a material including silicon, such as an un-diced silicon wafer, or a silicon chip that is formed by dicing a silicon wafer. The through via 121 may be a through silicon via (TSV).

The dam layer 130 is located between the first substrate 110 and the second surface 126 of the second substrate 120. At least one portion of the dam layer 130 protrudes toward the through via 121. The photoresist layer 140 is located on the first surface 124 and the sidewall surface 122 of the second substrate 120, the dam layer 130 that protrudes toward the through via 121, and is located between the conductive pad 112 and the dam layer 130 that protrudes toward the through via 121. The conductive layer 150 is located on the photoresist layer 140 and the conductive pad 112.

Since the photoresist layer 140 is located on the first surface 124 and the sidewall surface 122 of the through via 121 of the second substrate 120, the dam layer 130 that protrudes toward the through via 121, and is located between the conductive pad 112 and the dam layer 130 that protrudes toward the through via 121, the conductive layer 150 is not likely to be suspended in midair between the dam layer 130 and the conductive pad 112 after the conductive layer 150 is formed on the photoresist layer 140 and the conductive pad 112, thereby preventing the conductive layer 150 from being broken due to suspension in air, thus improving product yield.

In this embodiment, the diameter of the through via 121 is gradually decreasing from the first surface 124 of the second substrate 120 to the second surface 126 of the second substrate 120 in a direction D. In other words, a diameter R1 is greater than a diameter R2. In addition, the semiconductor structure 100 may further include an isolation layer 160. The isolation layer 160 is located on the second surface 126 of the second substrate 120. In another embodiment, the semiconductor structure 100 may have no isolation layer 160.

Figure 3:
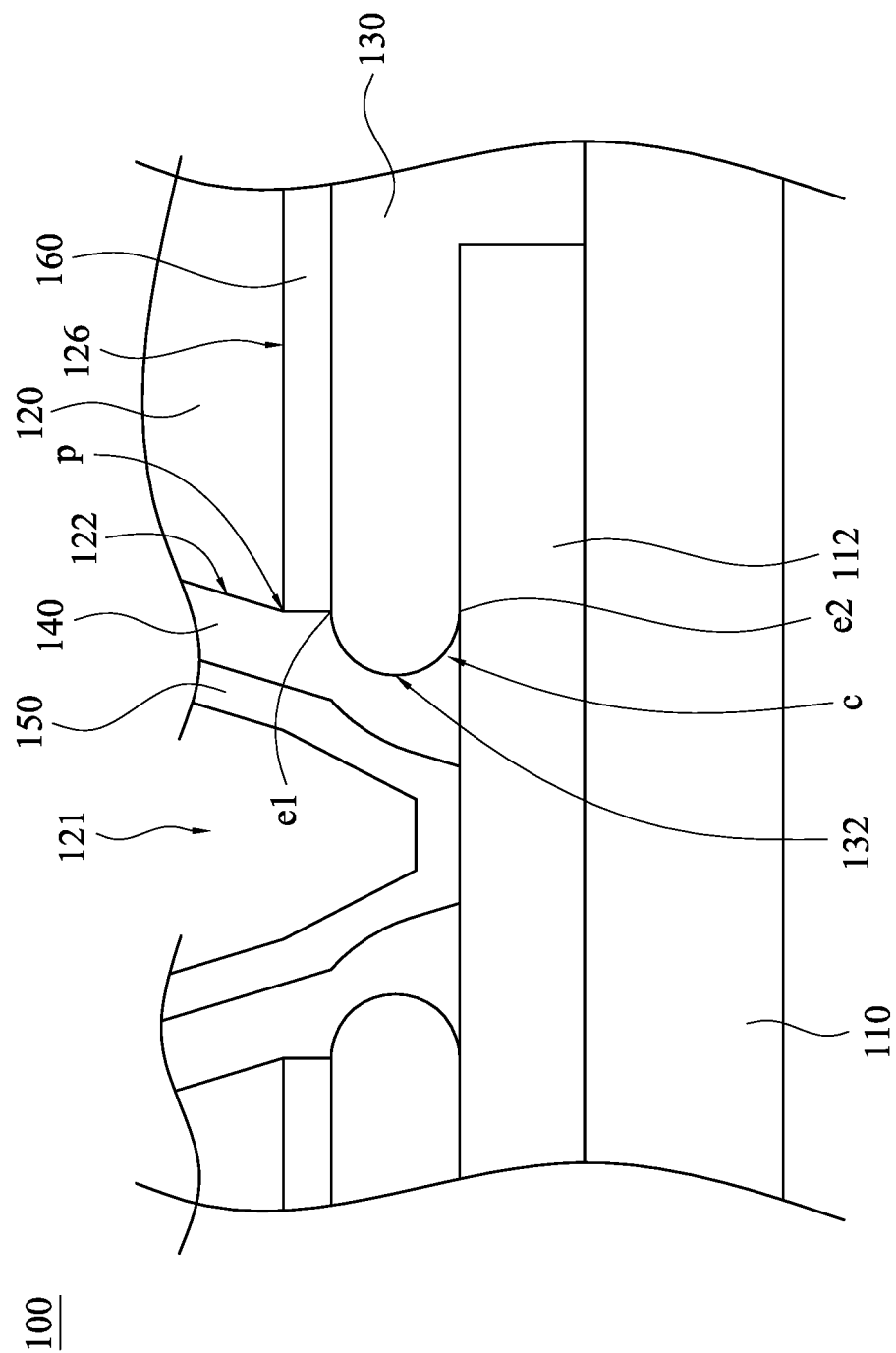
FIG. 3 is a partially enlarged view of the semiconductor structure shown in FIG. 2.

FIG. 3 is a partially enlarged view of the semiconductor structure 100 shown in FIG. 2. As shown in FIG. 2 and FIG. 3, when the first substrate 110 and the second substrate 120 are bonded by using the dam layer 130, the dam layer 130 easily protrudes toward the through via 121 due to a pressure and a high temperature. In this embodiment, the dam layer 130 protruding toward the through via 121 has an arc surface 132, and a cavity c is formed between the arc surface 132 and the conductive pad 112. Moreover, a connection position P between the sidewall surface 122 and the second surface 126 of the second substrate 120 is located on an edge e1 of the arc surface 132, and another edge e2 of the arc surface 132 is located on the conductive pad 112.

The photoresist layer 140 is in a liquid state before being baked. Hence, the photoresist layer 140 can be first coated on the first surface 124 and the sidewall surface 122 of the second substrate 120, the dam layer 130 that protrudes toward the through via 121, and between the conductive pad 112 and the dam layer 130 that protrudes toward the through via 121, such that the cavity c can be filled with the photoresist layer 140. After the photoresist layer 140 is baked, the photoresist layer 140 is changed to a solid state from the liquid state. After the conductive layer 150 is formed on the photoresist layer 140 and the conductive pad 112, the conductive layer 150 is not easily broken at the position of the cavity c.

Since the semiconductor structure 100 of the present invention has the photoresist layer 140, a typical oxide layer can be omitted. As a result, the costs associated with a chemical vapor deposition process and an etching process for the typical oxide layer can be saved, thereby reducing the manufacturing cost of the semiconductor structure 100.

It is to be noted that the connection relationships and the materials of the elements described above will not be repeated in the following description. In the following description, a manufacturing method of the semiconductor structure 100 will be described.

FIG. 4 is a flow chart of a manufacturing method of a semiconductor structure according to one embodiment of the present invention. The manufacturing method of the semiconductor structure includes the following steps. In step S1, a first substrate and a second substrate that is bonded to the first substrate are provided, and a dam layer is located between the first and second substrates. Thereafter, in step S2, the second substrate is etched, thereby forming a through via in the second substrate. A conductive pad of the first substrate is exposed through the through via, and at least one portion of the dam layer protrudes toward the through via. Afterwards, in step S3, a photoresist layer is formed on a surface of the second substrate facing away from the dam layer, a sidewall surface of the second substrate surrounding the through via, the dam layer that protrudes toward the through via, and the conductive pad that is exposed through the through via. Subsequently, in step S4, the photoresist layer is patterned, such that at least one portion of the conductive pad is exposed through the through via. Thereafter, in step S5, a conductive layer is formed on the photoresist layer and the conductive pad that is exposed through the through via.

In the following description, the aforesaid steps in the manufacturing method of the semiconductor structure will be explained.

Figure 5:
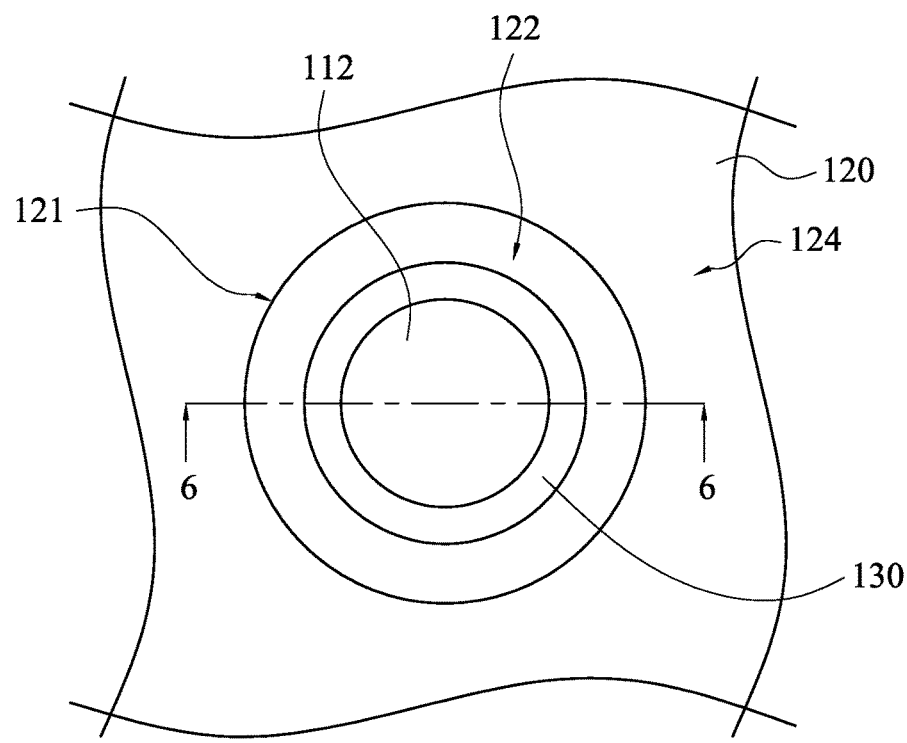
FIG. 5 is a top view of a through via after being formed in a second substrate according to one embodiment of the present invention.
Figure 6:
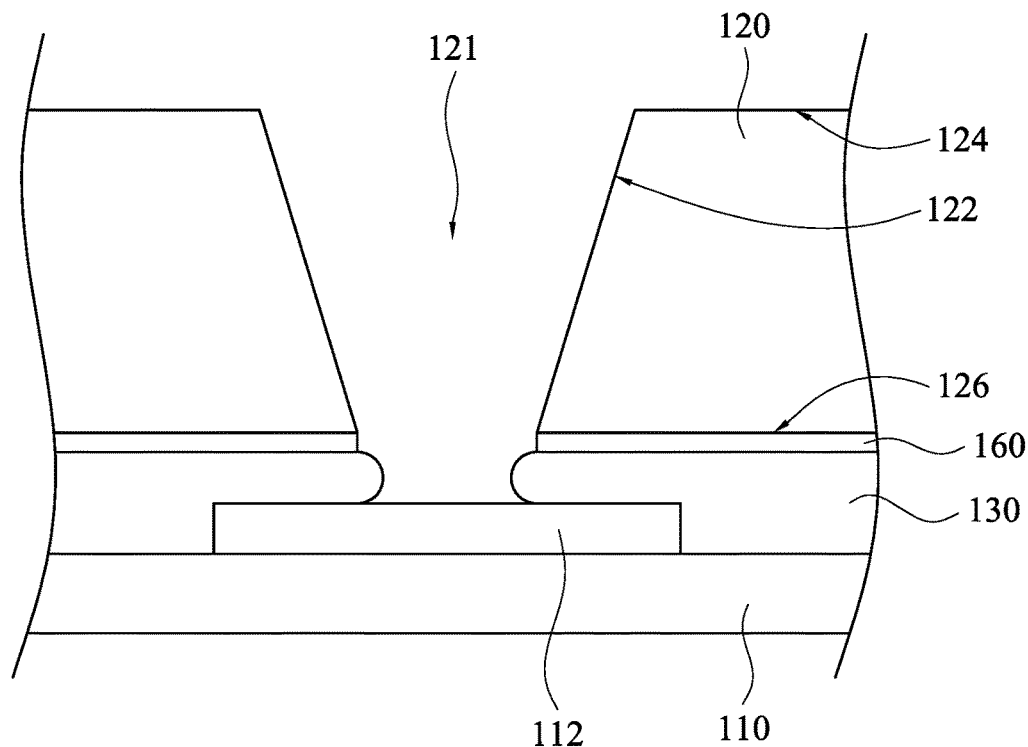
FIG. 6 is a cross-sectional view taken along line 6-6 shown in FIG. 5.

FIG. 5 is a top view of the through via 121 after being formed in the second substrate 120 according to one embodiment of the present invention. FIG. 6 is a cross-sectional view taken along line 6-6 shown in FIG. 5. As shown in FIG. 5 and FIG. 6, first of all, the first substrate 110 and the second substrate 120 that is bonded to the first substrate 110 may be provided, and the dam layer 130 is located between the first and second substrates 110, 120. Before the second substrate 120 is bonded to the first substrate 110, the dam layer 130 may be located on the first substrate 110 or the second substrate 120, but the present invention is not limited in this regard. Thereafter, the second substrate 120 may be etched, thereby forming the through via 121 in the second substrate 120, such that the conductive pad 112 of the first substrate 110 may be exposed through the through via 121 of the second substrate 120. Since the dam layer 130 protrudes toward the connection position between the sidewall surface 122 and the second surface 126 in the bonding process due to pressure and high temperature, at least one portion of the dam layer 130 protrudes toward the through via 121 after the through via 121 is formed.

Figure 7:
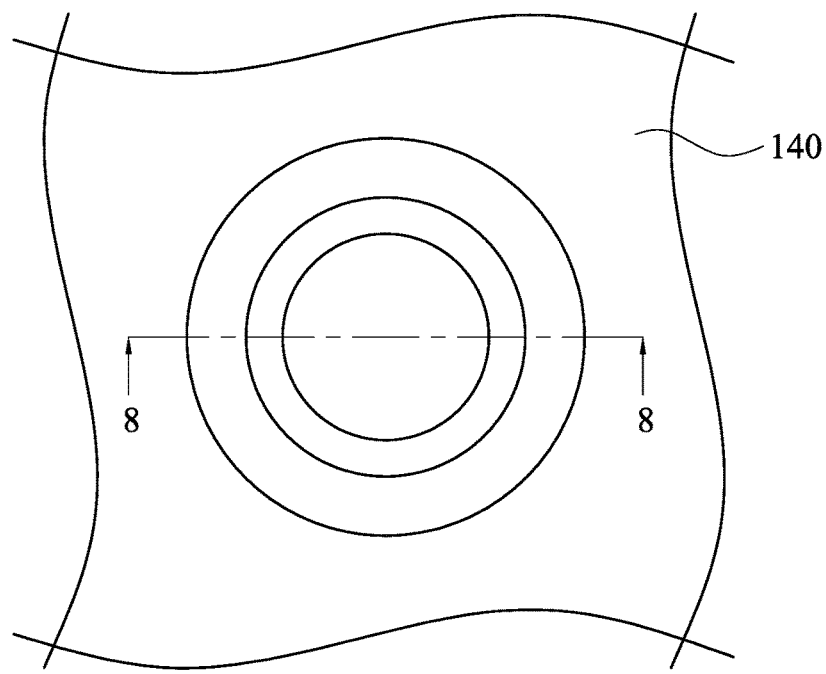
FIG. 7 is a top view of a photoresist layer after being formed on the second substrate, a dam layer, and a conductive pad shown in FIG. 6.
Figure 8:
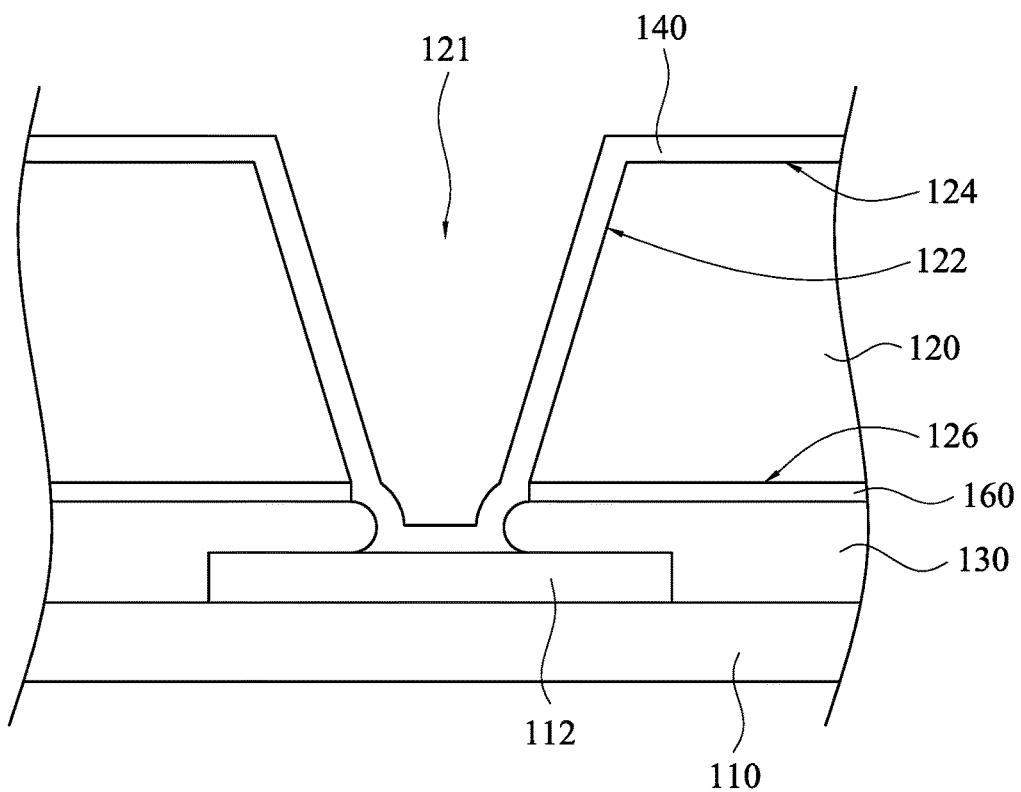
FIG. 8 is a cross-sectional view taken along line 8-8 shown in FIG. 7.

FIG. 7 is a top view of the photoresist layer 140 after being formed on the second substrate 120, the dam layer 130, and the conductive pad 112 shown in FIG. 6. FIG. 8 is a cross-sectional view taken along line 8-8 shown in FIG. 7. As shown in FIG. 7 and FIG. 8, after the through via 121 is formed, the photoresist layer 140 may be formed on the first surface 124 of the second substrate 120 facing away from the dam layer 130, the sidewall surface 122 of the second substrate 120 surrounding the through via 121, the dam layer 130 that protrudes toward the through via 121, and the conductive pad 112 that is exposed through the through via 121. In this embodiment, the photoresist layer 140 may be formed by spin coating. Alternatively, the photoresist layer 140 may be formed by spray coating as deemed necessary by designers.

Figure 9:
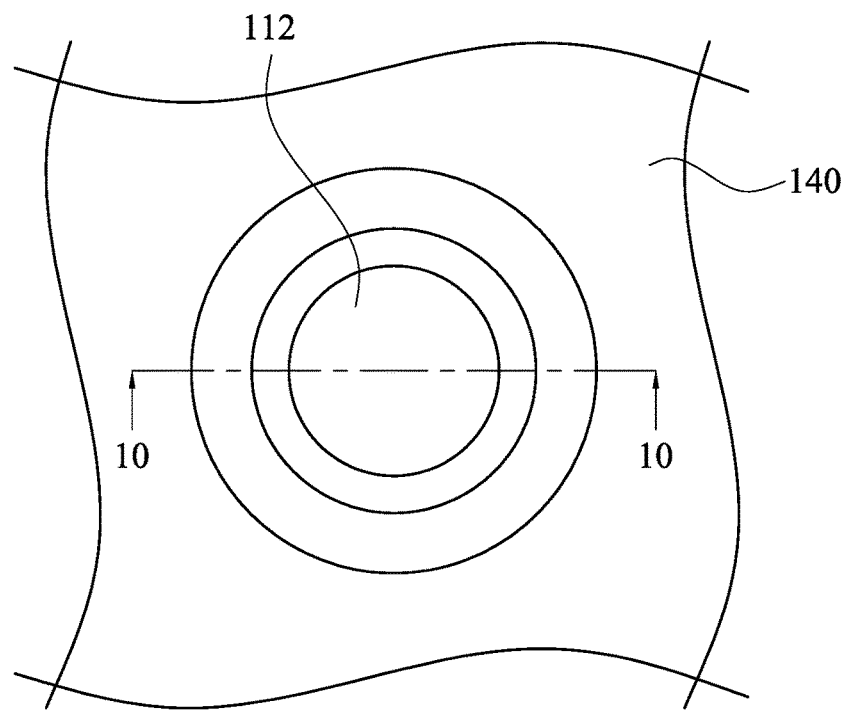
FIG. 9 is a top view of the photoresist layer shown in FIG. 8 after being patterned.
Figure 10:
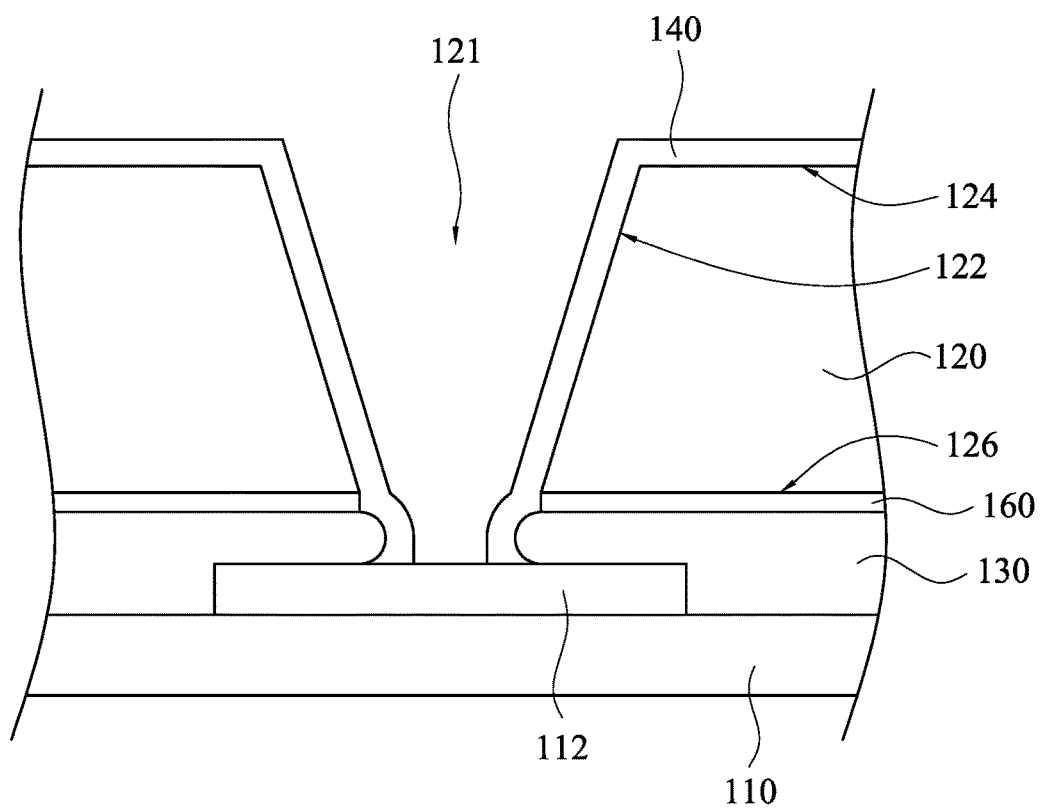
FIG. 10 is a cross-sectional view taken along line 10-10 shown in FIG. 9.

FIG. 9 is a top view of the photoresist layer 140 shown in FIG. 8 after being patterned. FIG. 10 is a cross-sectional view taken along line 10-10 shown in FIG. 9. As shown in FIG. 9 and FIG. 10, after the photoresist layer 140 is formed, the photoresist layer 140 may be patterned, such that at least one portion of the conductive pad 112 is exposed through the through via 121. When the photoresist layer 140 is patterned, an exposure treatment may be performed on the photoresist layer 140, and then an develop treatment may be performed on the photoresist layer 140, such that an opening of the photoresist layer 140 communicating with the through via 121 is formed.

As shown in FIG. 10 and FIG. 2, after the conductive pad 112 is exposed through the through via 121, the conductive layer 150 may be formed on the photoresist layer 140 and the conductive pad 112 that is exposed through the through via 121. In this embodiment, the conductive layer 150 is formed by sputtering. The conductive layer 150 may be made of a material including aluminum. After the conductive layer 150 is formed on the photoresist layer 140 and the conductive pad 112, the semiconductor structure 100 shown in FIG. 2 can be obtained.

In the manufacturing method of the semiconductor structure of the present invention, the photoresist layer 140 is used to replace a typical oxide layer. Hence, the costs associated with a chemical vapor deposition process and an etching process for the typical oxide layer may be saved, thereby reducing the manufacturing cost of the semiconductor structure 100.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A semiconductor structure, comprising:
    a first substrate having a conductive pad;
    a second substrate having a through via, a sidewall surface surrounding the through via, a first surface, and a second surface opposite to the first surface, wherein the through via penetrates through the first surface and the second surface, and the conductive pad is aligned with the through via;
    a dam layer located between the first substrate and the second surface of the second substrate, wherein at least one portion of the dam layer protrudes toward the through via;
    a photoresist layer located on the first surface and the sidewall surface of the second substrate, the dam layer that protrudes toward the through via, and between the conductive pad and the dam layer that protrudes toward the through via; and
    a conductive layer located on the photoresist layer and the conductive pad.

2. The semiconductor structure of claim 1, wherein the dam layer protruding toward the through via has an arc surface.

3. The semiconductor structure of claim 2, wherein a cavity is formed between the arc surface and the conductive pad.

4. The semiconductor structure of claim 3, wherein the cavity is filled with the photoresist layer.

5. The semiconductor structure of claim 2, wherein a connection position between the sidewall surface and the second surface of the second substrate is located on an edge of the arc surface, and another edge of the arc surface is located on the conductive pad.

6. The semiconductor structure of claim 1, further comprising:

an isolation layer located on the second surface of the second substrate.

7. The semiconductor structure of claim 1, wherein a diameter of the through via is gradually decreasing from the first surface of the second substrate to the second surface of the second substrate.

8. A manufacturing method of a semiconductor structure, the manufacturing method comprising:
   providing a first substrate and a second substrate that is bonded to the first substrate, wherein a dam layer is located between the first and second substrates;
   etching the second substrate to form a through via in the second substrate, wherein a conductive pad of the first substrate is exposed through the through via, and at least one portion of the dam layer protrudes toward the through via;
   forming a photoresist layer on a surface of the second substrate facing away from the dam layer, a sidewall surface of the second substrate surrounding the through via, the dam layer that protrudes toward the through via, and the conductive pad that is exposed through the through via;
   patterning the photoresist layer, thereby exposing at least one portion of the conductive pad through the through via; and
   forming a conductive layer on the photoresist layer and the conductive pad that is exposed through the through via.

9. The manufacturing method of the semiconductor structure of claim 8, wherein forming the photoresist layer comprises:
   forming the photoresist layer is performed by spin coating.

10. The manufacturing method of the semiconductor structure of claim 8, wherein forming the photoresist layer comprises:
    forming the photoresist layer is performed by spray coating.

11. The manufacturing method of the semiconductor structure of claim 8, wherein patterning the photoresist layer comprises:
    performing an exposure treatment onto the photoresist layer; and
    performing a development treatment onto the photoresist layer after the exposure treatment.

12. The manufacturing method of the semiconductor structure of claim 8, wherein forming the conductive layer comprises:
    forming the conductive layer by sputtering.

* * * * *